United States Patent [19]
Satou et al.

[11] Patent Number: 4,676,194
[45] Date of Patent: Jun. 30, 1987

[54] APPARATUS FOR THIN FILM FORMATION
[75] Inventors: Mamoru Satou, Kawanishi; Kouichi Yamaguchi, Hayato, both of Japan
[73] Assignee: Kyocera Corporation, Kyoto, Japan
[21] Appl. No.: 822,814
[22] Filed: Jan. 27, 1986

Related U.S. Application Data
[62] Division of Ser. No. 724,188, Apr. 17, 1985.

[30] Foreign Application Priority Data
Apr. 18, 1984 [JP] Japan ................... 59-79231
[51] Int. Cl.⁴ ............................................. C23C 16/00
[52] U.S. Cl. ................................... 118/720; 118/621; 118/723; 118/726
[58] Field of Search .................. 427/38; 118/723, 720, 118/621, 726

[56] References Cited
U.S. PATENT DOCUMENTS
4,152,478  5/1979  Takagi ................................. 427/42

Primary Examiner—Bernard D. Pianalto
Attorney, Agent, or Firm—Spensley Horn Jubas & Lubitz

[57] ABSTRACT

A method for forming a thin film on a substrate, which comprises aligning an evaporation means for an evaporating material to be deposited on the substrate, a plasma generating zone for dissociating an ion-forming gas into ions and electrons, an ion beam accelerating zone for accelerating the resulting ions and irradiating them onto the substrate, and said substrate on a substantially straight line in the order stated, and depositing a vapor of the evaporating material on the substrate through the plasma generating zone and the ion beam accelerating zone. According to this method, surface irradiation can be carried out uniformly because the ion species and the vapor atoms are irradiated in quite the same direction. Furthermore, the vapor atoms can be activated to a high degree, and the by-product electrons can be effectively utilized for the evaporation of the evaporant.

9 Claims, 2 Drawing Figures

APPARATUS FOR THIN FILM FORMATION

This is a division of application Ser. No. 724,188, filed on Apr. 17, 1985.

BACKGROUND OF THE INVENTION

1. Field of the Invention

This invention relates to an improvement in a method for forming a thin film comprising a combination of ion beam deposition and vacuum evaporation, and more specifically, to a method and an apparatus for producing a thin film of high quality, for example a thin high-quality film of boron nitride (to be referred to as BN) of high hardness.

2. Description of the Prior Art

The present inventors previously proposed a novel method for forming a thin film comprising a combination of ion irradiation and vacuum deposition in Japanese Laid-Open Patent Publication No. 2022/1983. This method is directed to the formation of a thin film of a metal compound on the surface of a substrate by ion beam deposition, in which accelerated ions are irradiated onto the substrate, and a vapor of the metal compound is irradiated on the substrate simultaneously or alternately with the irradiation of the ions. According to this method, the evaporant to be deposited is chemically combined with the ions by utilizing the activated energy or kinetic energy of the accelerated ions and a new material is formed on the substrate.

FIG. 2 of the accompanying drawings is a schematic view showing a typical apparatus for carrying out this method of thin film formation. A gas to be ionized, for example nitrogen, is introduced into an ion source 2 via a leak valve 1 and ionized there. The ions are then accelerated by an accelerator 3 to impart a predetermined ion accelerating energy. The ions are then introduced into an analyzer magnet 4 where only the required ion species are magnetically selected and supplied to a reaction chamber 5.

The reaction chamber 5 is maintained under a high vacuum of $10^{-4}$ torr or less by a vacuum pump 6 (for example, a turbo molecular pump). A substrate 7 is fixed to a substrate holder 8 and the selected ion species are irradiated on the substrate. In order to irradiate the ion species uniformly on the substrate 7, it is desirable to pass the ion species through a focusing lens 9.

An evaporation device 10 is disposed below the substrate 7. This device is heated by a suitable method, for example by electron beam heating or laser beam heating. The evaporation device 10 includes an evaporation source containing B, for example. The amount of the evaporation source containing B to be deposited and the deposition speed can be measured by a vibratory film thickness tester 11 including a quartz plate, for example, which is disposed side by side with the holder 8.

The number of atoms of the ion species, i.e. the ionic current, can be accurately measured by an integrating ammeter 13 having a secondary electron repelling electrode 12 annexed to it.

A voltage-adjustable bias power supply 14 is connected between the substrate 7 and the secondary electron repelling electrode 12 so that a negative bias voltage is applied to the substrate 7.

In this device, the substrate 7 is set at a predetermined position, and the inside of the reaction chamber 5 is maintained at a predetermined degree of vacuum. By operating the evaporation device 10, the evaporation source containing boron is evaporated and deposited in a predetermined amount on the substrate 7. Furthermore, a predetermined ion species is irradiated on it with a predetermined ion acceleration energy. When at the same time, a predetermined negative bias voltage is applied to the substrate, a thin film of BN having a high hardness and composed mainly of cubic BN (CBN) and hexagonal closed packing BN (WBN) is formed on the surface of the substrate 7.

Since the composition of the thin film to be formed is determined by prescribing the ratio between the ions to be irradiated and the deposited atoms, thin films of different compositions, for example a BN film, can be easily produced by varying this ratio.

In the aforesaid method of thin film formation, the path of the ion atoms to be irradiated toward the substrate 7 from the ion source 2 and the path of the evaporating atoms to be irradiated toward the substrate 7 from the metal vapor evaporating device do not exist in the same direction. Hence, according to the apparatus shown in FIG. 2, the evaporating atoms are projected at an inclined angle toward the substrate 7, and owing to minute raised and depressed portions on the surface of the substrate 7 or a film-forming surface, shaded parts occur microscopically which remain non-irradiated with the evaporated atoms. Uniform surface irradiation is, therefore, impossible.

Furthermore, although it would be easy for the ion atoms to attain a highly excited level on the substrate 7, the evaporating atoms are not activated. If, therefore, the evaporating atoms are deposited after they are caused to gain an activated energy state, the reaction and combination with the ion atoms can favorably be facilitated.

Furthermore, in the thin-film forming apparatus based on this conventional method, an ion-forming gas is introduced into a plasma generating zone of an ion source to generate ions. During this time, all the electrons generated simultaneously flow to the ground through the wall surface of the ion source, and consequently, the high energy of the electrons is wastefully discharged.

SUMMARY OF THE INVENTION

It is an object of this invention to provide a method and an apparatus for forming a thin film of high quality by a combination of ion beam deposition and vacuum evaporation, wherein uniform surface irradiation free from shading is carried out by aligning a path of ion beams and a path of atoms to be deposited in the same direction.

Another object of this invention is to provide a method and an apparatus for forming a thin film wherein a material to be evaporated and deposited is activated simultaneously with the formation of high-energy ions in ion beam deposition.

Still another object of this invention is to provide a method and an apparatus for forming a thin film wherein electrons generated in an ion generating zone are also effectively utilized for the evaporation within this system of a material to be deposited.

A further object of this invention is to provide a method and an apparatus for forming a thin film of good quality, for example, a high-quality thin film of BN having high hardness on a substrate at a high speed of film formation.

According to this invention, there is provided a method for forming a thin film on a substrate, which comprises aligning an evaporation means for an evaporating material to be deposited on the substrate, a plasma generating zone for dissociating an ion-forming gas into ions and electrons, an ion beam accelerating zone for accelerating the resulting ions and irradiating them onto the substrate, and said substrate on a substantially straight line in the order stated, and depositing a vapor of the evaporating material on the substrate through the plasma generating zone and the ion beam accelerating zone.

In another aspect, the electrons generated in the plasma-generating zone are irradiated in the form of beams onto the evaporating material to be deposited in the aforesaid method.

According to this invention, there is also provided an apparatus for forming a thin film on a substrate, comprising an evaporation means for evaporating an evaporating material to be deposited on the substrate, a plasma generating zone for dissociating an ion-forming gas into ions and electrons, an ion beam accelerating zone for accelerating the resulting ions and irradiating them on the substrate, and a mechanism for supporting said substrate, said members of the apparatus being aligned on a substantially straight line in the order stated; a extraction electrode disposed between the plasma generating zone and the ion beam accelerating zone for extracting the ions to the ion beam accelerating zone; and an accelerating mechanism provided between the plasma generating zone and the evaporation means for accelerating the electrons formed in the plasma generating zone toward the evaporating material to be deposited.

BRIEF DESCRIPTION OF THE ACCOMPANYING DRAWINGS

FIG. 1 is a schematic view of the thin film forming apparatus of this invention; and FIG. 2 is a schematic view of the conventional thin film-forming apparatus.

DETAILED DESCRIPTION OF PREFERRED EMBODIMENTS

Figure 1:
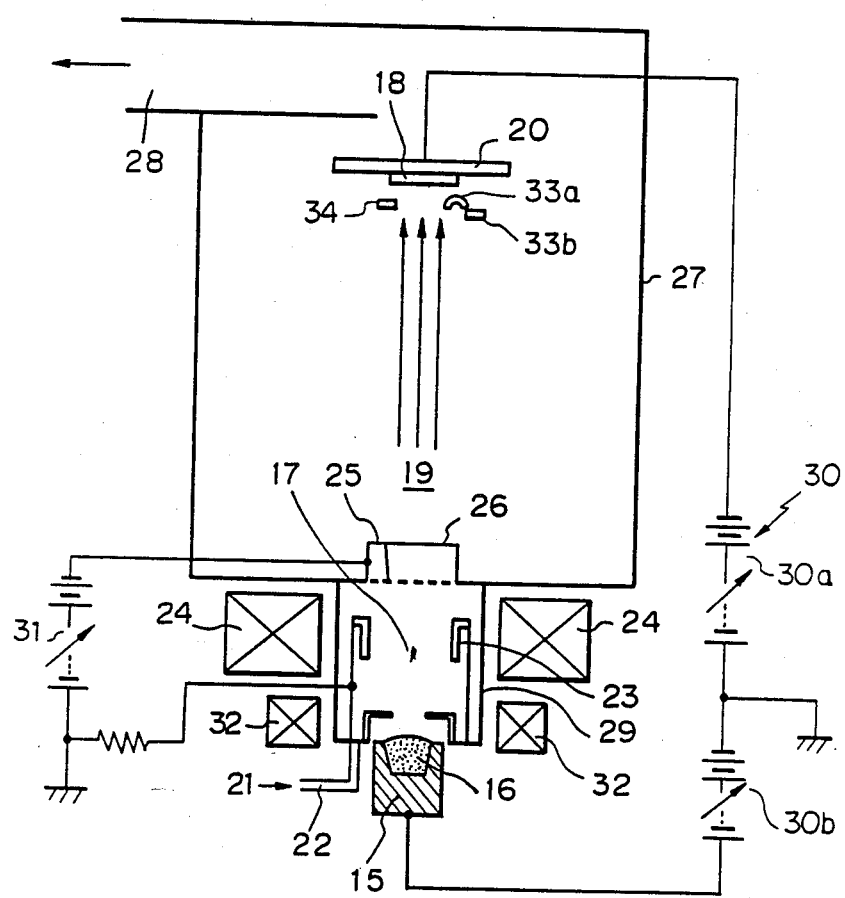

The marked characteristic of this invention is that an evaporating material 16 to be deposited which is held by a holder mechanism 15, a plasma generating zone 17 for dissociating an ion-forming gas into ions and electrons, an ion beam accelerating zone 19 for accelerating the resulting ions and irradiating them onto a substrate 18, and the substrate 18 supported on a supporting mechanism 20 are all aligned on a substantially straight line in this order, as shown in FIG. 1.

In a plasma generating chamber 29 in FIG. 1, the holding mechanism 15 such as a copper hearth containing the evaporating material 16 such as metallic boron is provided at the bottom, and the plasma generating zone 17 exist above it. A gas introducing tube 22 for introduction of the ion-forming gas 21 into the plasma generating zone 17 is provided, and around it are disposed a filament 23 for emitting thermoelectrons and a plasma generating magnet coil 24. An extraction electrode 25 in grid or lattice form, for example, is provided between the plasma generating zone 17 and the ion beam accelerating zone 19 above it for extracting the ions generated in the plasma generating zone 17 into the accelerating zone 19.

An accelerating mechanism, a lens 26 in FIG. 1, is provided in the ion beam accelerating zone 19 in order to accelerate the extract ions in the form of beams. The lens 26 may be composed of a extracting lens, a decelerating lens and an accelerating lens (not shown) known per se either alone or in combination. The substrate 18 on which the ions and vapor are irradiated are received within a reaction chamber 27 above the accelerating zone 19 while it is supported by the supporting mechanism 20. At one end of the chamber 27 is provided a gas exhausting port 28 connected to a suction vacuum pump (not shown) so as to direct flows of reacting atoms or molecules in a direction at right angles to the substrate.

The substrate 18 and the holder mechanism 15 are connected to a dc power supply so that the substrate 18 is of negative polarity and the holder mechanism 15 is of positive polarity. In the illustrated embodiment, the dc power supply 30 is comprised of an ion accelerating variable negative power supply 30a and an electron accelerating variable positive power supply 30b which are connected in series to each other through the earth. The plasma generating chamber 29 is grounded through a resistor so as to avoid flow out of electrons, and the ion extraction electrode 25 is connected to a variable negative power supply 31 for applying a bias voltage which enables ions to be taken out.

An electron focusing magnet coil 32 is disposed between the plasma generating zone 17 and the evaporating material 16 for accelerating the electrons generated in the plasma generating zone in the form of beams toward the evaporating material 16.

The ion-forming gas 21 introduced through the gas introducing tube 22 enters the plasma generating chamber 29 having the plasma generating zone 17. Then, by emitting thermoelectrons from the filament 23, a plasma is generated, and at the same time, the efficiency of plasma generation is increased by the plasma generating magnet coil 24. As a result, the dissociated ions and electrons are produced in the plasma generating zone 17.

The resulting ions are taken out of the plasma generating zone 17, namely into the reaction chamber 27 maintained under a high vacuum of $10^{-4}$ torr or less by a vacuum pump, by the action of the extraction electrode 25 to which a negative bias voltage is applied. The ions are focused and accelerated by the action of the lens 26 and irradiated as accelerated ion beams onto the substrate 18 to which a negative bias voltage is applied.

In the present invention, the kinetic energy of the ions is desirably set at 0.01 KeV to 100 KeV, per atom, preferably, 0.1 KeV to 40 KeV per atom. This adjustment makes it easy to form the desired thin film although it depends on the type of the evaporant material.

According to the present apparatus, the electrons generated in the plasma generating zone 17 are used as a source of supply of electron beams for heating the evaporating material of the vacuum evaporation means to be described below.

In the vacuum evaporation means provided in the thin film forming apparatus of this invention, the copper hearth 15 containing the metallic substance 16 to be deposited, for example, B, is provided at a part of the wall surface of the plasma generating chamber 17. A voltage is applied across the copper hearth 16 and the substrate 18 by the dc power supply 30b so that the copper hearth 16 becomes positive. As a result, the electrons in the plasma generating zone 17 are irradiated in the form of beams onto the metallic substance 16 by the electron focusing magnet coil 32, whereby the metallic substance 16 is heated and becomes easily evaporable. The evaporated metallic substance, while being highly ionized during passage through the plasma generating zone 17, is finally deposited on the substrate 18.

According to the present invention described above, the ion beams and the evaporating material can be irradiated simultaneously onto the substrate in completely the same direction. Hence, uniform surface irradiation without shading can be effected, and a thin uniform film having a high quality can be formed.

Furthermore, by irradiating the evaporating material on the subtrate through the plasma generating zone and the ion accelerating zone, the evaporating material can be highly activated, and the reaction of the evaporating material with the ions can be more easily carried out.

Another advantage of the present invention is that the electrons generated in the plasma generating zone are effectively utilized for the heating and evaporation of the evaporating material, and therefore the energy cost can be curtailed, and the structure of the evaporating means can be simplified.

Heating of the evaporating material is not limited to the aforesaid embodiment, and may be carried out by laser beam heating or heating by a heater with or without electron beam heating.

The suitable negative voltage ($E_1$) to be applied to the substrate is $-0.01$ KV to $-20$ KV, preferably $-0.1$ KV to $-10$ KV. The suitable negative voltage ($E_2$) to be applied to the drawing electrode is $-0.01$ KV to $-100$ KV, preferably $-5$ KV to $-40$ KV. The suitable positive voltage to be applied to the evaporating material is 1 to 20 KV, preferably 4 to 10 KV.

For example, a thin film of BN having high hardness may be formed by using the apparatus described above in the following manner. The substrate 18 is set at a predetermined position, and the inside of the reaction chamber 27 is maintained at a predetermined degree of vacuum. By operating the evaporating means, evaporating atoms are evaporated from the evaporation source 16 containing B, passed through the plasma generating zone 17 and deposited in a predetermined amount on the substrate 18. At the same time, an ion species at least containing nitrogen is irradiated onto the substrate by a predetermined ion accelerating energy and simultaneously a predetermined negative bias is applied to the substrate 18. Consequently, a highly hard thin film composed of BN is formed on the surface of the substrate 18.

It is believed that according to this invention, the ion species containing nitrogen relatively easily attains a high energy level of the $SP^3$ hybridized orbital on the substrate. On the other hand, the boron vapor gains an activated energy state while being ionized during passage through the plasma generating zone 17, and is deposited on the substrate. Hence, boron becomes easily combined with the nitrogen atom by $SP^3$ bonding.

Furthermore, according to this invention, a path of the nitrogen ion species directed toward the substrate is the same as a path of boron directed toward the substrate and both are directed in a direction generally perpendicular to the substrate. Hence, uniform surface irradiation without shading can be carried out. Thus, the desired highly hard BN film can be formed efficiently at a high speed of film formation.

The evaporation source containing boron may be at least one of metallic boron and boron compounds such as boron nitride, boron sulfide, phosphorus boride, hydrogen boride, metallic borides containing aluminum or magnesium and borides of transition metals.

The ion species may be an ion species having a predetermined ion acceleration energy which acts on the evaporation source containing B to form a thin film of BN having high hardness and being composed mainly of CBN-WBN. Preferably, it is either one of a nitrogen atom ion ($N^+$); a nitrogen molecule ion ($N_2^+$); an ion of a nitrogen compound such as an ammonia ion ($NH_3^+$); an ion of a boron compound such as a boron nitride ion ($BN^+$); and an inert gas ion such as $Ar^+$. $B_3N_3H_6$ or $Al_2B_2N_4$ may be ionized and used as the ion species. Alternatively, the nitrogen-containing ion species may be used together with such an ion species as a boron ion ($B^+$) or a hydrogen boride ion ($B_2H_6^+$).

Such an ion species is created in the plasma generating zone and supplied to the surface of the substrate.

The substrate may be of any material such as ceramics, superhard alloys, cermets or various metals or alloys. However, if the substrate is an electrical insulator, the characteristics of a film deposited thereon will vary between a charged site and a non-charged site and variations in characteristics tend to occur easily throughout the film. The substrate is therefore preferably an electric conductor. The electric insulator may be used if a thin film of an electric conductor is formed on its surface by a conventional method.

It is important that in the formation of the thin BN film in accordance with this invention, the ion acceleration energy of the ion species should be 5 to 100 KeV per atom of the ion species.

If the non acceleration energy of this ion species is less than 5 KeV, the amount of the ion species injected into the deposited film decreases and the sputtering phenomenon becomes dominant. If it exceeds 100 KeV, the ion species is implanted much deeper than the deposited layer on the surface of the substrate, and it is difficult to form a highly hard BN film composed mainly of CBN or WBN in the deposited layer. Furthermore, the temperature of the deposited layer becomes too high, and the formation fo HBN becomes dominant and a highly hard BN film composed maily of CBN is difficult to form.

In this embodiment of this invention, the B/N atomic ratio supplied from the evaporating source and the ion species is desirably adjusted to a range of from 0.2 to 10, and this leads to the formation of a BN film of very high quality. Experiments have shown that the optimum B/N atomic ratio is in the range of from 0.5 to 5.

Furthermore, in this embodiment of the invention, in conjunction with the setting of the ion acceleration energy of the ion species within a predetermined range, the dose rate (the ionic current per unit area of the substrate) of the ion species is desirably prescribed such that the amount of heat generated in the substrate by the irradiation of the ion species becomes 0.01 to 20 W per $cm^2$ of the substrate. If it is exceeds 20 W, the temperature of the boron deposited layer becomes too high, and the formation of HBN becomes dominant, and a highly hard BN film composed of CBN or WBN is difficult to form. On the other hand, if it is less than 0.01 W, the implant and recoil effect and thermal effect by the ion species cannot be obtained, and it is difficult to synthesize CBN or WBN.

Preferably, in the present invention, the temperature of the substrate is set at $-200°$ to $+700°$ C.

If the temperature of the substrate is set at $-200°$ to $+700°$ C., a highly excited state produced locally and instantaneously can be easily maintained, and the resulting CBN or WBN can be freezed to avoid conversion to HBN. If the temperature of the substrate is less than −200° C., the BN film formed on the substrate surface is liable to peel off. If it exceeds 700° C., the resulting The substrate 18 was heated by a ceramic heater (not shown).

The results obtained are summarized in Table 1.

TABLE 1

| Sample No. | Atomic B/N ratio | Ion accelerating energy per ion (KeV) | Volatge of the negative power supply for ion acceleration (KV) | Temperature of the substrate (°C.) | Speed of film formation (Å/min.) | Electric resistance (ohms-cm) | Hardness (Hv; kg/mm$^2$) |
|---|---|---|---|---|---|---|---|
| 1 | 12 | 30 | 0.01 | 200 | 600 | $3 \times 10^5$ | 3000 |
| 2 | 9 | 30 | 0.01 | 200 | 450 | $2 \times 10^9$ | 3500 |
| 3 | 5 | 30 | 0.01 | 200 | 360 | $1.5 \times 10^{10}$ | 5100 |
| 4 | 2 | 30 | 0.01 | 200 | 220 | $2.2 \times 10^{10}$ | 6300 |
| 5 | 1 | 30 | 0.01 | 200 | 150 | $2.4 \times 10^{10}$ | 6900 |
| 6 | 0.6 | 30 | 0.01 | 200 | 20 | $2.9 \times 10^{10}$ | 5400 |
| 7 | 0.5 | 30 | 0.01 | 200 | 14 | $1.6 \times 10^{13}$ | 4800 |
| 8 | 0.1 | 30 | 0.01 | 200 | 6 | $3 \times 10^{15}$ | 4100 |
| 9 | 1 | 30 | 0.1 | 200 | 150 | — | 6900 |
| 10 | 1 | 30.5 | 0.5 | 200 | 165 | — | 7000 |
| 11 | 1 | 31.5 | 1.5 | 200 | 180 | — | 7050 |
| 12 | 1 | 32.0 | 2.0 | 200 | 180 | — | 7100 |
| 13 | 1 | 3 | 0.01 | 200 | 6 | — | 2500 |
| 14 | 1 | 10 | 0.01 | 200 | 15 | — | 3500 |
| 15 | 1 | 20 | 0.01 | 200 | 60 | — | 5200 |
| 16 | 1 | 50 | 0.01 | 200 | 160 | — | 7000 |
| 17 | 1 | 100 | 0.01 | 200 | 120 | — | 6900 |
| 18 | 1 | 210 | 0.01 | 200 | 105 | — | 3100 |
| 19 | 1 | 30 | 0.01 | 50 | 180 | — | 6700 |
| 20 | 1 | 30 | 0.01 | 400 | 180 | — | 6900 |
| 21 | 1 | 30 | 0.01 | 700 | 180 | — | 6500 |
| 22 | 1 | 30 | 0.01 | 800 | 180 | — | 4000 |

CBN or WBN is liable to change to HBN. Experiments have shown that the optimum temperature of the substrate is 0° to 400° C.

The following examples illustrate the present invention more specifically.

EXAMPLE 1

Figure 2:
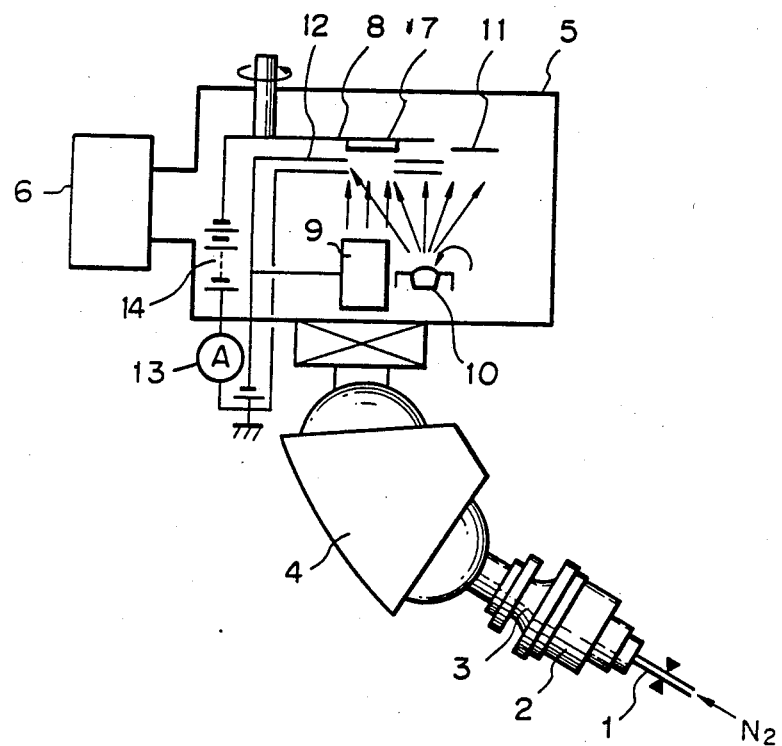

A thin film was formed under the following conditions by using an apparatus of the type shown in FIG. 2.
Evaporating material: metallic boron
Ion-forming gas: nitrogen gas
Substrate: Single crystal silicon
Degree of vacuum in the reaction chamber: $2 \times 10^{-5}$ torr
Ion accelerating negative voltage ($E_1$): See Table 1
Negative voltage ($E_2$) applied to the drawing electrode: 35 KV
Positive voltage ($E_3$) applied to the evaporating material: 4 KV
Temperature of the substrate: See Table 1

When nitrogen gas is used, $N_2^+$ and $N^+$ ions are the main ion species, and the doses of these ions were measured by using a Faraday cup 33a and a calorimeter 33b shown in FIG. 1. The thickness of the film was measured by a film thickness monitor 34 (FIG. 1) based on quartz oscillation.

The B/N atomic ratio was adjusted by changing the electron acceleration voltage ($E_3$) and the current to the electron focusing lens 32 and thereby changing the amount of metallic boron evaporated.

The BN composition ratio in the film was determined as follows: The BN composition ratio of a sample was determined by the Rutherford's back scattering method. Based on the result obtained, calibration curves with respect to the measured values in the film thickness monitor, the Faraday cut and the calorimeter were prepared, and the BN composition ratio of the film was then determined from the calibration curves.

With reference to Table 1, it is noted that samples Nos. 1 to 8 have varying atomic ratios of B/N, and sample No. 5 having a B/N atomic ratio of 1 shows the largest hardness.

In samples Nos. 9 to 12, the ion acceleration energy per ion becomes larger as the voltage of the negative power supply for ion acceleration becomes larger. As a result, the hardness becomes slightly higher, and the speed of film formation increases.

It is noted with reference to samples 13 to 18 that if the ion acceleration energy is limited within a predetermined range, excellent hardness characteristics can be obtained, and the speed of film formation can be increased.

With samples Nos. 19 to 22, the hardness characteristics were examined by varying the temperature of the substrate.

EXAMPLE 2

Production of an AlN film:
An AlN film of high quality was formed by using an apparatus of the type shown in FIG. 1.

Specifically, a silicon substrate was set at the supporting mechanism 20, and the inside of the reaction chamber 27 was evacuated to $2 \times 10^{-6}$ torr. Highly pure $N_2$ gas was introduced into the plasma generating chamber to form $N_2^+$ and $N^+$ ions. The ions were passed through the accelerating zone and irradiated onto the substrate. At this time, the electrons generated in the plasma generating chamber 17 were irradiated on highly pure Al which is the evaporating material 16, and accelerated. Thus, Al was evaporated. The evaporated Al atoms were highly activated during passage through the plasma generating chamber 17 and the ion beam accelerating zone 19 and deposited on the substrate.

The conditions for the formation of the AlN film were as follows:

Degree of vacuum in the reaction chamber: less than $1\times10^{-4}$ torr

Negative voltage for ion acceleration: 2 KV

Ion accelerating energy: 20 KeV

After film formation for one hour, an AlN film having a thickness of 9000 Å was obtained.

In this example, the Al atoms were also excited and therefore the resulting AlN film was of high quality and dense. The adhesion of the film to the substrate was excellent.

A comb-like electrode was formed in the AlN thin film, and the sonic velocity of the Rayleigh's waves propagating on its surface was measured and found to be 5700 m/s. Hence, it was found to have the excellent characteristics of an SAW element.

When Ti, Ta, W and Cr were respectively used instead of Al as the evaporating material 16, thin films of highly pure nitrides of the respective metals were obtained.

EXAMPLE 3

Production of an amorphous silicon film:

Example 2 was repeated except that hydrogen gas was used instead of the nitrogen gas, and Si was used instead of Al. By using a mixture of hydrogen gas and 1 ppm of $B_2H_6$ as the doping gas, there was obtained an amorphous silicon film whose valence electron could be controlled.

EXAMPLE 4

Production of a TiC film:

Example 2 was repeated except that a superhard alloy drill was used as the substrate 18, metallic Ti was used as the evaporating material 16, and methane gas was used as the ion-forming gas 21. The operation was performed for 1 hour to coat a TiC film having a thickness of 1 micrometer on the drill. During the operation, the drill was vibratorily rotated.

Ion irradiation increased the nucleus generating density, and fine Tic particles grew. In addition, since the Ti atoms were deposited in the highly activated state, the denseness of the resulting film and its adhesion to the substrate increased. Furthermore, the composition of the film was uniform since the two materials were irradiated in the same directions. It was found that the drill coated in this example had a service life about twice as long as that obtained by RF ion plating.

EXAMPLE 5

Production of an $Al_2O_3$ film:

Example 2 was repeated except tha single crystal silicon was used as the substrate 18, metallic Al was used as the evaporating material, and oxygen gas was used as the ion-forming gas 21. By performing the operation for 1 hour, an $Al_2O_3$ film having a thickness of 6000 Å was obtained.

The resulting film was found to have a surface resistance of $10^{12}$ ohms-cm.

When methane gas was used as the ion-forming gas 21 in the above procedure, an $Al_4C_3$ film could be formed.

What is claimed is:

1. An apparatus for forming a thin film on a substrate, comprising:

(i) evaporation means for evaporating an evaporating material to be deposited on the substrate;

(ii) a plasma generating zone for dissociating an ion-forming gas into ions and electrons;

(iii) a thermoelectron emitting filament disposed in said plasma generating zone;

(iv) a plasma generating magnet coil fitted at an outer peripheral position of said plasma generating zone;

(v) a gas introducing tube for introduction of the ion-forming gas into said plasma generating zone;

(vi) an ion beam accelerating zone for accelerating the resulting ions and irradiating them on the substrate;

(vii) an extraction electrode disposed between the plasma generating zone and the ion beam accelerating zone for extracting the ions to the ion beam accelerating zone;

(viii) an electron accelerating mechanism provided between the plasma generating zone and the evaporation means for accelerating the electrons produced in the plasma generating zone toward the evaporating material;

(ix) a DC power supply connected between the substrate and the evaporation means which maintains the substrate in negative polarity and the evaporation means in positive polarity; and (x) a mechanism for supporting said substrate, wherein the evaporation means (i), the plasma generating zone (ii), the ion beam accelerating zone (iii) and the substrate supporting mechanims (iv) are aligned on a substantially straight line in the order stated.

2. An apparatus for forming a thin film on a substrate, comprising:

(i) a reaction chamber for housing a substrate;

(ii) ionizing means, in flow communication with the reaction chamber, for ionizing atoms into positively charged ions and electrons;

(iii) gas means for introducing ionizable gas atoms into the ionizing means;

(iv) holding means, in flow communication with the ionizing means, for holding an evaporatable material;

(v) electron heating means for directing electrons, resulting from ionization by the ionizing means, toward the holding means so that atoms of an evaporatable material in the holding means will be evaporated into the ionizing means; and (vi) ion directing means for directing ions of gas and evaporatable material from the ionizing means to the substrate in said reaction chamber.

3. The apparatus of claim 2, wherein the holding means, the ionizing means, the ion directing means and the substrate are disposed in a substantially straight line in the recited order.

4. The apparatus of claim 2, wherein the ion directing means comprises means for directing gas ions and ionized evaporated material onto the substrate in a same direction.

5. The apparatus of claim 2, wherein the ionizing means defines an ionizing zone wherein the gas atoms and atoms of the evaporated material are ionized, said ionizing means including a thermoelectron emitting filament and a plasma generating magnet disposed adjacent the ionizing zone.

6. The apparatus of claim 2, wherein the electron heating means includes a magnet coil disposed between the ionizing means and the holding means for focusing the electrons resulting from gas ionization onto the evaporatable material.

7. A system for forming a thin film on a substrate, comprising:

(i) ionizing means for ionizing atoms into positively charged ions and electrons;

(ii) gas supply means for supplying atoms of an ionizable gas to the ionizing means;

(iii) a supply of evaporatable material in flow communication with said ionizing means;

(iv) evaporating means for directing electrons, resulting from ionization of the gas atoms by the ionizing means, at the supply of evaporatable material, so that atoms of the evaporatable material are evaporated into the ionizing means;

(v) a substrate in flow communication with said ionizing means; and (vi) ion directing means for directing gas ions and ions of evaporatable material, produced by the ionizing means, onto the surface of said substrate.

8. The system of claim 7, wherein said ionizing means defines an ionizing zone and includes:

a thermoelectron emitting filament disposed in the ionizing zone; and a plasma generating magnet disposed adjacent to the ionizing zone.

9. The system of claim 7, wherein the supply of evaporatable material, the ionizing means, the ion directing means and the substrate are disposed in a substantially straight line in the recited order.

* * * * *